US009223912B1

(12) United States Patent
Liapis et al.

(10) Patent No.: US 9,223,912 B1
(45) Date of Patent: Dec. 29, 2015

(54) SYSTEMS, METHODS AND DEVICES FOR PROVIDING RLCK PARASITIC EXTRACTION BACK-ANNOTATION IN ELECTRONIC DESIGN AUTOMATION

(71) Applicant: Helic, Inc., San Jose, CA (US)

(72) Inventors: Apostolos Liapis, Athens (GR); Lampros Kokkalas, Athens (GR); Manuela Andreea Mironiuc, Athens (GR); Georgios Katsoulis, Athens (GR); Panteleimon Papadopoulos, Athens (GR)

(73) Assignee: Helic, Inc., San Jose, CA (US)

( * ) Notice: Subject to any disclaimer, the term of this patent is extended or adjusted under 35 U.S.C. 154(b) by 0 days.

(21) Appl. No.: 14/482,296

(22) Filed: Sep. 10, 2014

(51) Int. Cl.
*G06F 17/50* (2006.01)

(52) U.S. Cl.
CPC ........ *G06F 17/5009* (2013.01); *G06F 17/5045* (2013.01)

(58) Field of Classification Search
USPC .......................................................... 716/110
See application file for complete search history.

(56) References Cited

U.S. PATENT DOCUMENTS

| | | | |
|---|---|---|---|
| 7,096,441 B2 | 8/2006 | Lo et al. | |
| 8,195,439 B1 * | 6/2012 | Hussain | ........................ 703/14 |
| 8,250,506 B2 | 8/2012 | Bantas et al. | |
| 8,453,102 B1 * | 5/2013 | Pack et al. | ..................... 716/139 |
| 8,468,482 B1 | 6/2013 | Pack et al. | |
| 8,478,553 B2 * | 7/2013 | Charlet et al. | .................. 702/65 |
| 2008/0216035 A1 * | 9/2008 | Dirks et al. | ....................... 716/6 |
| 2014/0183692 A1 * | 7/2014 | Yeh | ................................ 257/531 |
| 2015/0074629 A1 * | 3/2015 | Chen et al. | ..................... 716/112 |
| 2015/0128102 A1 * | 5/2015 | Perry et al. | ..................... 716/137 |

OTHER PUBLICATIONS

Chapter 6—"Background on Floating Random Walk (FRW)," pp. 117-122 (6 pages).
"F3D—Fast Accurate 3D RC Extraction," *Silicon Frontline Technology*, info@siliconfrontline.com (1 page).
"Variance Reduction in Monte Carlo Capacitance Extraction," Batterywalla, et al. (6 pages).
"A Stochastic Algorithm for High Speed Capacitance Extraction in Integrated Circuits," Y.L. Le Coz et al., *Solid-State Electronics*, vol. 35, No. 7, pp. 1005-1012, 1992 (8 pages).

(Continued)

*Primary Examiner* — Suchin Parihar
(74) *Attorney, Agent, or Firm* — Nixon Peabody LLP

(57) ABSTRACT

Systems, computer-readable storage media, and methods of providing RLCK parasitic extraction for electronic design of integrated circuits are presented herein. For one implementation, the method includes: importing a simulator netlist extracted from the schematic file that simulates the IC, the simulator netlist providing nets and devices in the schematic; importing the layout file which represents the physical layout of the IC; generating from the layout file a connectivity list with connectivity points in the IC for connecting generated RLCK parasitics; extracting from the layout file an RLCK netlist for the connectivity points; generating from the layout data file and the connectivity list a cross-reference between the connectivity points and the nets and devices in the simulator netlist; from the cross-reference, simulator netlist, and RLCK netlists, update the simulator netlist to includes RLCK parasitics for the connectivity points in the IC; and output an indication of the updated simulator netlist.

20 Claims, 4 Drawing Sheets

(56) References Cited

OTHER PUBLICATIONS

"An Efficient Capacitance Extractor Using Floating Random Walks," M. Desai et al., *Indian Institute of Technology*, Oct. 30, 1998, pp. 1-10 (10 pages).

"A Floating Random-Walk Algorithm for Extracting Electrical Capacitance," Ralph B. Iverson, et al., *Mathematics and Computers in Simulation*, 55 (2001), pp. 59-66 (8 pages).

"Field Solver Technologies for Variation-Aware Interconnect Parasitic Extraction," Tarek Ali El-Moselhy, *Dept. of Electrical Engineering and Computer Science*, Jan. 28, 2009, pp. 3-4 (2 pages).

"StarRC Custom Rapid3D Extraction—Next Generation high Performance 3D Fast Field Solver," Shah, et al., *Synopsys Predictable Success*, Jun. 2010, pp. 1-7 (7 pages).

"Sess Rapid3D 20X Performance Improvement," *Synopsys Predictable Success*, Greg Rollins, Jul. 19, 2010, pp. 1-12 (Power Point slideshow) (12 pages).

"Fast Floating Random Walk Algorithm for Multi-Dielectric Capacitance Extraction with Numerical Characterization of Green's Functions," Zhuang, et al., *Dept. of Computer Science at Tsinghua University* 2012 IEEE, pp. 377-382 (6 pages).

"RWCap: A Floating Random Walk Solver for 3-D Capacitance Extraction of Very-Large-Scale Integration Interconnects," W. Yu, et al., *IEEE Transactions on Computer-Aided Design of Integrated Circuits and Systems*, vol. 32, No. 3, Mar. 2013, pp. 353-360 (8 pages).

"Efficient Techniques for the Capacitance Extraction of Chip-Scale VLSI Interconnects Using Floating Random Walk Algorithm," C. Zhang, et al., *Tsinghua National Laboratory for Information Science and Technology, Dept. of Computer science & Technology, Tsinghua University*, 2014, pp. 756-761 (6 pages).

\* cited by examiner

SYSTEMS, METHODS AND DEVICES FOR PROVIDING RLCK PARASITIC EXTRACTION BACK-ANNOTATION IN ELECTRONIC DESIGN AUTOMATION

TECHNICAL FIELD

The present disclosure relates generally to software tools for designing and modeling electronic systems, such as printed circuit boards and integrated circuits. More particularly, aspects of this disclosure relate to systems, methods and devices for providing parasitic extraction in electronic design automation (EDA) of integrated circuits.

BACKGROUND

Integrated circuits are the cornerstone of the information age and the foundation of today's information technology industry. The integrated circuit, a.k.a. "chip" or "microchip," is a set of interconnected electronic components, such as transistors, capacitors, and resistors, which are etched or imprinted onto a tiny wafer of semiconducting material, such as silicon or germanium. Integrated circuits take on various forms including, as some non-limiting examples, microprocessors, amplifiers, Flash memories, application specific integrated circuits (ASICs), static random access memories (SRAMs), digital signal processors (DSPs), dynamic random access memories (DRAMs), erasable programmable read only memories (EPROMs), electrically erasable programmable read only memories (EEPROMs), and programmable logic. Integrated circuits are used in innumerable products, including personal, laptop and tablet computers, consumer electronics, such as smartphones and flats-screen televisions, medical instruments, telecommunication and networking equipment, airplanes, and automobiles.

Advances in integrated circuit (IC) technology and microchip manufacturing have led to a steady decrease in chip size and an increase in circuit density and circuit performance. Modern day integrated circuits, while small enough to fit in the hand of child, have millions of devices, including logic gates and transistors, and a very complex photolithographic layout. The scale of semiconductor integration has advanced to the point where a single semiconductor chip can hold tens of millions to over a billion devices in a space smaller than a U.S. penny. Moreover, the width of each conducting line in a modern microchip can be made as small as a fraction of a nanometer. The operating speed and overall performance of a semiconductor chip (e.g., clock speed and signal net switching speeds) has concomitantly increased with the level of integration. To keep pace with increases in on-chip circuit switching frequency and circuit density, semiconductor packages currently offer higher pin counts, greater power dissipation, more protection, and higher speeds than packages of just a few years ago.

A variety of specialized software tools have been developed to meet the challenges of designing and manufacturing more complex and higher performance electronic systems such as printed circuit boards and integrated circuits. Layout verification software, for example, is used to verify that a design of an IC chip conforms to certain manufacturing tolerances that are required in fabricating the chip, to ensure that the layout connectivity of the physical design of a chip matches the logical design of the chip represented by a schematic, and to model parasitic resistance and capacitance of the chip (known as "parasitic extraction"). These tools exist in one or more areas commonly referred to as electronic design automation (EDA), electronic computer aided design (ECAD), and technology computer aided design (TCAD). A single EDA platform can offer software modules for integrated circuit layout design, behavioral simulation, and functional analysis and verification.

For many EDA platforms, rules are specified in order to check the consistency between a physical design of a particular microchip, known as a "layout" in the art, and a logical design of that microchip, referred to as a "schematic." In an operation, these rules are known as Layout Versus Schematic (LVS) rules. For some implementations, running a command file of LVS rules will extract devices and nets formed across the chip's layout hierarchy, and will then compare them to a schematic netlist for that chip to ensure that the layout connectivity of the physical design of a circuit matches the logical design of the circuit as defined by a schematic. In this regard, rule sets known as Layout Parasitic Extraction (LPE) rules are also specified to extract parasitic resistance and capacitance information from different sections of a chip. For a command file of LPE rules, the software platform will identify and simulate electromagnetic phenomena due to parasitic resistance and capacitance of the circuit.

As chip-interconnect and device-critical dimensions are reduced and, concomitantly, system frequency is increased, many additional parasitic effects must be considered and accounted for during system design, simulation and evaluation. Parasitic effects can cause inadvertent cross-coupling of signals, a reduction in signal voltage, and noise in signal, clock, and power distribution networks. If not properly accounted for during system design, there is an increased risk that the IC will experience functional failure or performance limitations following fabrication and implementation. Parasitics can radically degrade logic levels, delay clock and signal speeds, and otherwise prevent circuits from performing as designed. In general, shielding is not possible. The volume of parasitic effects has been increasing for each technology generation and, with increases in circuit size, complexity, and function, simulating the impact of these parasitics is an enormous challenge requiring very large computing resources and time.

Several tools and methodologies have been developed based on equivalent circuit extraction to allow for fast and accurate modeling of metallic interconnects belonging to a semiconductor layout. In such methodologies, the interconnect structures of the integrated circuit are divided into smaller sections, and each section is modeled by an equivalent circuit that models its electromagnetic behavior, including electrical behavior, along with any parasitic couplings to the substrate or other nearby structures. The aforementioned LPE methodologies are usually fast and efficient, and their output is usually a circuit netlist comprising R (resistor) and C (capacitor) lumped elements. Some methods are also capable of separately producing L (inductance) and K (mutual inductance) elements which, besides resistor and capacitor elements, are oftentimes required to accurately model the electromagnetic (EM) behavior of an IC at higher frequencies. There is a continuing need to improve these tools for each technology generation in order to address requirements for higher integration, greater functional capability and complexity, smaller chip area, and better performance of integrated circuits.

SUMMARY

Disclosed herein are systems, methods, devices and computer program products for providing parasitic extraction in electronic design of integrated circuits. Some implementations are directed to novel flows for adding resistance-inductance-capacitance-mutual inductance (RLCK) parasitics to electronic design automation (EDA) platforms, while taking into account layout hierarchy and providing magnetic coupling effects on any level to the top-level simulation bench. Some aspects of the disclosed concepts focus on electromagnetic-modeling for back-annotation of design flow in EDA for accommodating LK parasitics. In some implementations, the back-annotation platform is designed to work on existing, completed designs such that modifications aren't needed. The schematic netlist can include RLCK parasitics on selected nets with no extra effort. For some implementations, the back-annotation platform supports full-chip extraction of inductance and mutual inductance and automatically synthesizes chip layouts.

Aspects of the present disclosure are directed to a method of providing resistance-inductance-capacitance-mutual inductance (RLCK) parasitic extraction for electronic design of an integrated circuit. The method includes: receiving a simulator netlist extracted from a schematic data file indicative of a simulated representation of the integrated circuit, the simulator netlist describing nets and devices in the schematic data file; receiving a layout data file indicative of a physical layout of the integrated circuit; determining from the layout data file a connectivity list with a plurality of connectivity points in the integrated circuit for connecting (or "stitching") generated RLCK parasitics; determining from the layout data file one or more RLCK netlists for the connectivity points; determining from the layout data file and the connectivity list a cross-reference between the connectivity points and nets and devices in a netlist; determining from the cross-reference, the simulator netlist, and the one or more RLCK netlists an updated simulator netlist which includes RLCK parasitics for the connectivity points in the integrated circuit; and, outputting an indication of the updated simulator netlist.

According to other aspects of the present disclosure, a computer-aided electronic design automation (EDA) system for electronic design of an integrated circuit is presented. The EDA system includes one or more user input devices, one or more display devices, one or more processors, and one or more memory devices. The at least one of the memory devices stores instructions which, when executed by at least one processor, causes the EDA system to perform certain operations. These operations include: import a simulator netlist extracted from a schematic data file indicative of a simulated representation of the integrated circuit, the simulator netlist describing nets and devices in the schematic data file; import a layout data file indicative of a physical layout of the integrated circuit; from the layout data file, generate a connectivity list with connectivity points in the integrated circuit for connecting generated RLCK parasitics; from the layout data file, extract one or more RLCK netlists for the connectivity points; from the layout data file and the connectivity list, generate a cross-reference between the connectivity points and nets and devices in a netlist; from the cross-reference, the simulator netlist, and the one or more RLCK netlists, update the simulator netlist to include RLCK parasitics for the connectivity points in the integrated circuit; and store and/or display an indication of the updated simulator netlist.

Other aspects of the present disclosure are directed to non-transitory computer-readable storage media that store instructions which, when executed by one or more processors of an integrated circuit design system, cause the one or more processors to perform any of the methods, modules and operations described herein. These operations may include, for example: receiving a simulator netlist extracted from a schematic data file indicative of a simulated representation of the integrated circuit, the simulator netlist describing nets and devices in the schematic data file; receiving a layout data file indicative of a physical layout of the integrated circuit; determining from the layout data file a connectivity list with a plurality of connectivity points in the integrated circuit for connecting generated RLCK parasitics; determining from the layout data file one or more RLCK netlists for the connectivity points; determining from the layout data file and the connectivity list a cross-reference between the connectivity points and nets and devices in a netlist; determining from the cross-reference, the simulator netlist, and the one or more RLCK netlists an updated simulator netlist which includes RLCK parasitics for the connectivity points in the integrated circuit; and, output an indication of the updated simulator netlist.

The above summary is not intended to represent each embodiment or every aspect of the present disclosure. Rather, the foregoing summary merely provides an exemplification of some of the novel aspects and features set forth herein. The above features and advantages, and other features and advantages of the present disclosure, will be readily apparent from the following detailed description of the representative embodiments and modes for carrying out the present invention when taken in connection with the accompanying drawings and appended claims.

Figure 1:
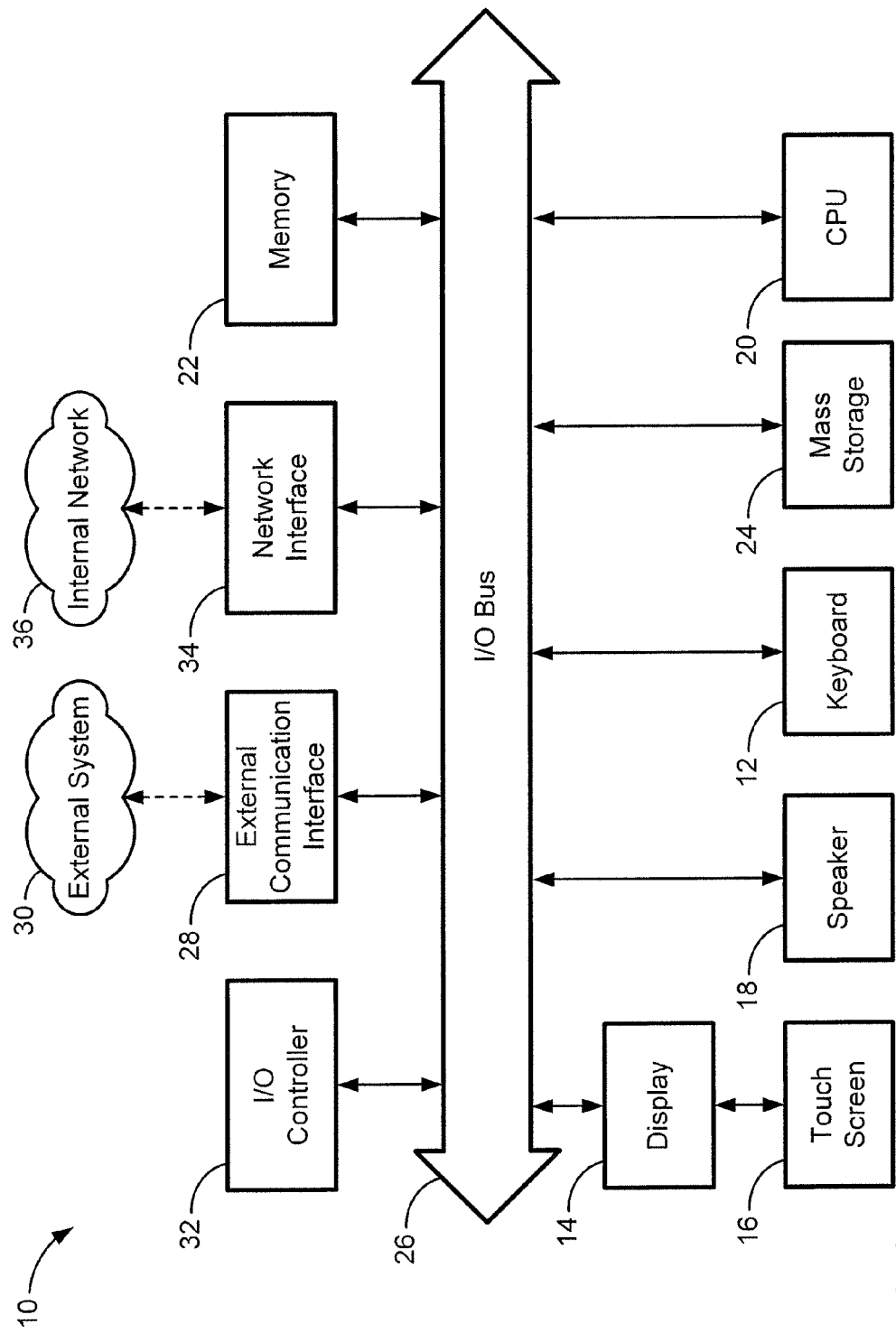
FIG. 1 is a schematic representation of an example of a system for modeling and simulating integrated circuits and providing RLCK parasitic extraction.

The present disclosure is susceptible to various modifications and alternative forms, and some representative embodiments have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

This invention is susceptible of embodiment in many different forms. There are shown in the drawings, and will herein be described in detail, representative embodiments of the invention with the understanding that the present disclosure is to be considered as an exemplification of the principles of the invention and is not intended to limit the broad aspects of the invention to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference or otherwise. For purposes of the present detailed description, unless specifically disclaimed: the singular includes the plural and vice versa; the words "and" and "or" shall be both conjunctive and disjunctive; the word "all" means "any and all"; the word "any" means "any and all"; and the word "including" means "including without limitation." Moreover, words of approximation, such as "about," "almost," "substantially," "approximately," and the like, can be used herein in the sense of "at, near, or nearly at," or "within 3-5% of," or "within acceptable manufacturing tolerances," or any logical combination thereof, for example.

Referring now to the drawings, wherein like reference numerals refer to like components throughout the several views, FIG. 1 illustrates an example of a system, designated generally as 10, for modeling and simulating integrated circuits and providing RLCK parasitic extraction. Many of the disclosed concepts are discussed with reference to the representative system depicted in the drawings; the system illustrated in FIG. 1 is provided merely as an exemplary application by which the various inventive aspects and features of this disclosure can be applied. Thus, the novel aspects and features of the present disclosure are not per se limited to the particular arrangements and components presented in the drawings. For example, many of the features and aspects presented herein can be applied to other computing and analysis systems without departing from the intended scope and spirit of the present disclosure. Moreover, only selected components of the system have been shown and will be described in additional detail hereinbelow. Nevertheless, the systems and devices discussed herein can include numerous additional and alternative features, and other well-known peripheral components, for example, for carrying out the various methods and functions disclosed herein. Some of the illustrated components are optional and, thus, can be removed. Those components which are not necessary for carrying out the aspects of the present disclosure will not be described in further detail.

FIG. 1 is block-diagram schematically illustrating an electronic design automation (EDA) computer system 10 for modeling and simulating integrated circuits and providing RLCK parasitic extraction. The EDA computer system 10 comprises one or more input devices, which can include (in any combination) a keyboard 12, a single-touch or multi-touch touchscreen 16, a mouse, a track ball, a track pad, flash and other solid-state drives, input ports, etc. For output, the EDA computer system 10 can include, in a few examples, a display device 14, which can include a high-resolution liquid crystal display (LCD) panel, a plasma display, or a light emitting diode (LED) or organic LED (OLED) display, one or more speakers 18, and other conventional I/O devices and ports. A cabinet (not shown) houses any or all of the illustrated components, including a processor or central processing unit (CPU) 20, a main memory 22, a mass storage device 24, and the like.

The CPU 20 may include any suitable processor(s), such as those made by INTEL®, TI® (Texas Instruments Inc.), and AMD®. By way of example, the CPU 20 may comprise plural microprocessors including a master processor, a slave processor, and a secondary or parallel processor. CPU 20, as used herein, may comprise any combination of hardware, software, or firmware disposed inside or outside of the EDA computer system 10 that is configured to communicate with or control the transfer of data between the computer system 10 and a bus, another computer, processor, device, service, or network. The CPU 20 comprises one or more controllers or processors and such one or more controllers or processors need not be disposed proximal to one another and may be located in different devices or in different locations. The CPU 20 is operable to execute any or all of the various methods, software platforms, and other processes and operations disclosed herein.

The CPU 20 is also connected to an input/output (I/O) bus 26, which can include any suitable bus technologies, such as an AGTL+frontside bus and a PCI backside bus. The I/O bus 26 facilitates connection between the various input devices, output devices, input/output devices, communication devices, etc., such as those discussed in connection with FIG. 1. The I/O bus 26 is also connected to an external communication interface 28, which is operable for connecting to one or more external system(s) 30 (e.g., EDA layout and schematic design suites). Arrows shown in FIG. 1 represent the system bus architecture of computer system 10; these arrows are representative of any interconnection scheme serving to link the various subsystems. Operation of the I/O bus 26 may be controlled by an I/O controller 32.

Mass storage device(s) 24 may include hardware, firmware, or any other tangible machine-readable storage media including instructions for performing the operations described herein. Machine-readable storage media includes any mechanism that stores information and provides the information in a form readable by a machine (e.g., a computing workstation). For example, machine-readable storage media includes floppy disks, mass disk drives, optical disks, magnetic disks, magneto-optical disks, hard disks, CD-ROMs, CDRs, DVDs, DVRs, flash and other nonvolatile solid-state storage (e.g., USB flash drive), battery-backed-up volatile memory, tape storage, reader, and other similar media, and combinations of these. The source code of the software of the present disclosure may also be stored or reside on the mass storage device(s) 24. For example, the mass storage device(s) 24 may store an EDA software design suite (e.g., design suite 40 of FIG. 2), such as for example the VIRTUOSO® IC Design Platform available from Cadence Design Systems, Inc., for the creation, modeling, comparison and verification of IC schematic and layout data files. As a further example, the mass storage device(s) 24 may store an RLCK parasitic extraction and back-annotation platform, such as Schematic-and-Layout Back-Annotation (no-LVS) Flow 150 of FIG. 2, Schematic-and-Layout Back-Annotation (LVS) Flow 250 of FIG. 3, and/or LVS and LPE Back-Annotation Flow 350 of FIG. 4. One or more of the foregoing platforms, or one or more segments thereof, may be stored remotely and transmitted via wired or wireless network(s), such as the Internet, to the system 10. Optionally, the RLCK parasitic back-annotation platforms of FIGS. 2-4, or one or more segments thereof, can be integrated into the design suite 40, and vice versa, without departing from the intended scope and spirit of the present invention.

The EDA computer system 10 may be connected via a network interface 34 to an internal computing network (intranet) 36 and may thereby interface with other computers using this network. For example, each computer on the internal network 36 may perform part or parts of the many series of circuit simulation steps in series or in parallel. The internal network 36 may be a wired network (e.g., using T-12 cabling), a telephone network (e.g., using a public switch telephone network (PSTN)), a packet network, or a wireless network, or any combination or combinations thereof.

Schematic-Layout Back-Annotation (No-LVS) Flow

Figure 2:
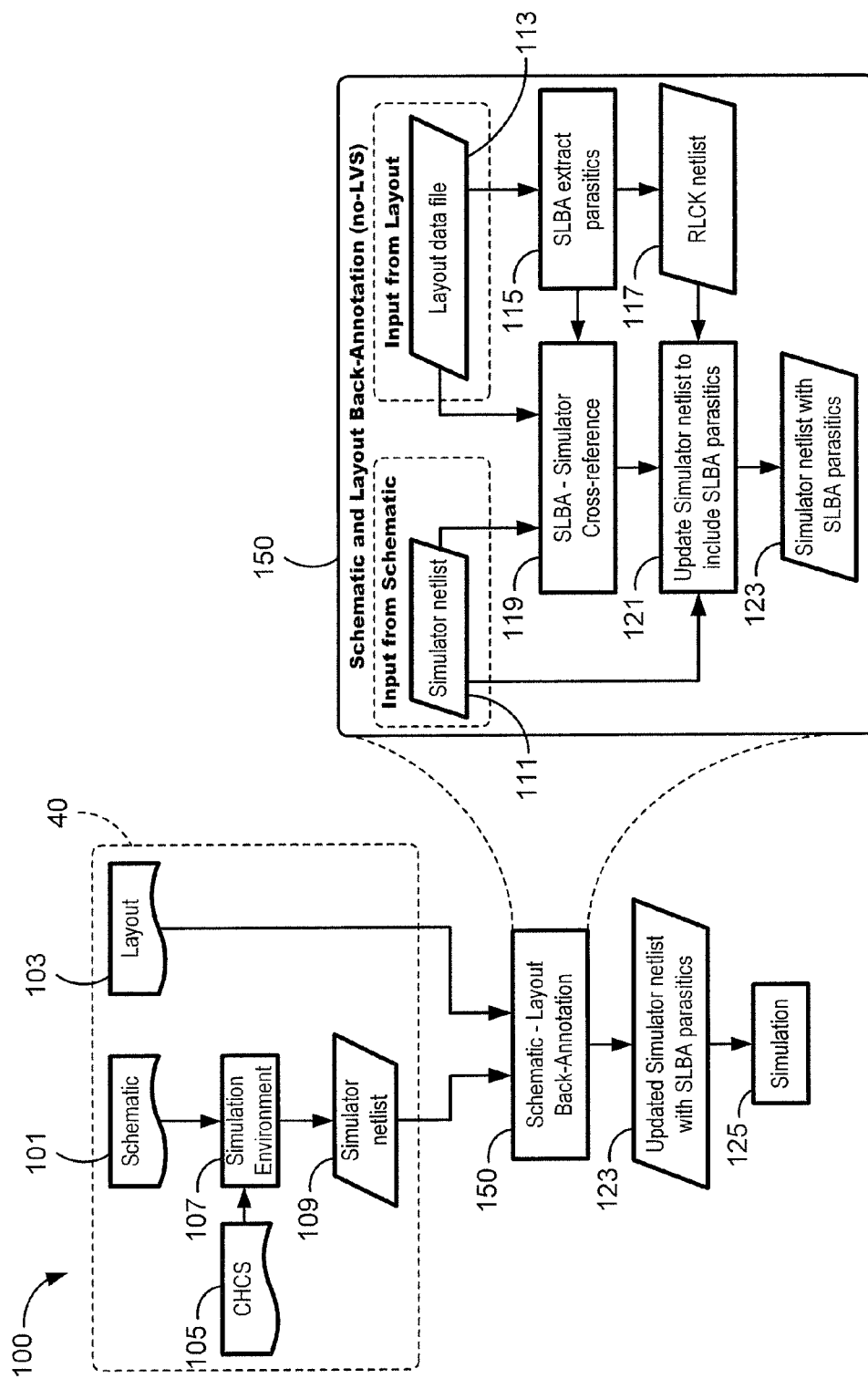
FIG. 2 is a flowchart for a representative method or algorithm for providing RLCK parasitic extraction in EDA of integrated circuits (Schematic-and-Layout Back-Annotation Flow (no-LVS)) that can correspond to instructions which can be stored on one or more non-transitory computer-readable media and can be executed by one or more controllers in accord with aspects of the disclosed concepts.

With reference now to the flow chart of FIG. 2, an improved method for providing RLCK parasitic extraction in computer-aided electronic simulation and design of integrated circuits is generally described at 100 in accordance with aspects of the present disclosure. FIG. 2 can be representative of an algorithm that corresponds to at least some instructions that can be stored, for example, in memory 22 or mass storage 24 of FIG. 1, and executed, for example, by the CPU 20, either alone or in cooperation with external system(s) 30 and/or internal network 36, to perform any or all of the above or below described functions associated with the disclosed concepts. Unless explicitly disclaimed or otherwise logically prohibited, the method 100 can incorporate or otherwise take on any of the various features, operations, optional configurations, and functional alternatives described herein with respect to the examples shown in FIGS. 3 and 4, and vice versa.

The method 100 starts in design suite 40 at blocks 101 and 103 with the generation of a schematic data file and a layout data file, respectively, of the IC design under investigation. An IC layout (also known as a "mask layout") is a representation of the physical design of an integrated circuit, namely the physical arrangement and interconnection of metal, oxide, and semiconductor layers that make up the components of the integrated circuit. Contrastingly, an IC schematic is a diagrammatic representation of the logical design of the circuit under investigation. The schematic view of the circuit can be created with any available schematic editor software platform including, for example, using the CADENCE® VIRTUOSO® Schematic Composer and Editor. Then, the circuit is simulated and analyzed, for example, using an available simulation environment software tool, such as the CADENCE® VIRTUOSO® Analog Design Environment (ADE). Once circuit specifications are fulfilled in simulation, the circuit layout can be created with any available layout editor software platform including, for example, the CADENCE® VIRTUOSO® Layout Editor and Layout Suite XL. The resulting layout can verify geometric rules dependent on the technology (design rules); a Design Rule Check (DRC) can be performed for enforcing these design rules. Optionally, electrical errors (e.g. shorts) can be detected using an Electrical Rule Check (ERC). As an aside, any reference made herein to a trademarked EDA software platform or tool is purely for purposes of explanation and should therefore not be considered as limiting the scope of the invention as detailed in the appended claims.

At block 105 of FIG. 2, a circuit hierarchy configuration setup (CHCS) is generated for the IC schematic. The CHCS, which is oftentimes referred to as a configuration view, is the test configuration a designer uses to simulate the IC design's test bench. The CHCS defines the binding of the schematic views of the IC design to simulate the circuit's ideal behavior, i.e., without any parasitics. A "test bench" is a virtual environment used to verify the correctness or soundness of a design, e.g., by applying stimulus to and checking the response from a semiconductor integrated circuit design, often referred to as a "device under test." The schematic data file and the CHCS are imported into an IC simulation environment, such as for example the CADENCE® VIRTUOSO® Analog Design Environment (ADE), at block 107. The IC design suite simulation environment can be operable as an application programming interface (API) for programmatically accessing data from the CHCS and schematic of the IC. The simulation environment product suite, in some embodiments, provides the capabilities to explore, analyze, and verify a design against the user's desired goals for thorough exploration and validation of the design. After defining a test bench, for example, users can run simulations and analyze the results using the simulation environment.

With continuing reference to FIG. 2, the simulation environment is used to generate a simulator netlist out of the schematic view and CHCS, as indicated at block 109. Depending on software and simulation engine, the netlist may be a SPECTRE® netlist, a SPICE netlist (including HSPICE, XSPICE, PSPICE, etc.), or any other known form, all of which can be generally referred to as a schematic netlist formatted in the user's simulator syntax or "simulator netlist" for short. The netlist specifies the components and connectivity of the circuitry. Components can include gates, devices, transistors, cells, logic blocks, input buffers, output buffers, memory cells, decoders, arithmetic logic unit (ALU), and other circuit blocks, for example. The connectivity includes, for example, power and ground wiring (carrying respectively, VDD and 0 volts) and the signal interconnect, which carry analog or digital signals that propagate between different blocks of the circuitry. The netlists discussed herein may optionally be a hierarchical or a flat netlist. A special parasitics netlist may be generated or the parasitics may be inserted in a netlist that already exists. The netlist can either contain or refer to descriptions of the parts or devices used. The interconnect netlist can be stored in a file, such as a database file (stored on a hard disk or server) for use by other processes or flows.

At blocks 111 and 113, respectively, the simulator netlist extracted from the schematic data file at block 109 and the layout data file generated at block 103 are imported into or otherwise received by a Schematic-and-Layout Back-Annotation (SLBA) Flow 150. As indicated above, the simulator netlist describes (all) the nets and devices in the schematic data file, whereas the layout data file is indicative of the physical layout of the integrated circuit under investigation. In the flow illustrated in FIG. 2, the SLBA 150 can provide RLCK parasitic extraction and back-annotation with only schematic and layout as input. In this embodiment, the schematic and layout information can be accessed or "read" without using CDL netlist, GDSII or other standardized database file formats. It is desirable for at least some embodiments that the layout be "generated" using a "schematic-driven layout" tool, i.e., correspondence between schematic and layout devices and nets should exist. For some applications, SLBA 150 cannot directly read the IC schematic and the IC layout, both of which are saved as binary database files on a third party design suite (e.g. CADENCE® VIRTUOSO®). As such, SLBA 150 can be operable to use a third party proprietary API for accessing the data from the design suite 40 database and other information like the schematic-driven layout database that provides cross reference data between schematic and layout (there is no "text-based" connectivity interface, but rather binary access through vendor's API). For example, SLBA 150 can use the CADENCE® Design Framework II (DFII) application programming interface (API) to read layout and schematic information from the VIRTUOSO® design suite.

The method 100 proceeds to block 115 of FIG. 2 where a connectivity list is generated or otherwise determined from the layout data file. This connectivity list comprises connectivity points within the integrated circuit for generating RLCK parasitics. By way of example, in this step of extraction, a call is made to the SLBA modeling engine and the top-level connectivity points (a.k.a. ports) in the IC are referenced. Top-level connectivity points can be considered design top level pins, plus the devices terminals; all these can be stored in the layout data file. At block 117, one or more RLCK netlists are generated for the connectivity points identified by the SLBA modeling engine at block 115. This RLCK netlist contains parasitics for (all) physical interconnects between devices. Parasitics from metal routing and physical connectivity between devices are extracted by an electromagnetic simulation engine to formulate a spice subcircuit of RLCK elements or an S-Parameter file of the top level ports.

From the layout data file, connectivity list, and simulator netlist, a cross-reference between the connectivity points identified at block 115 and the nets and devices in the simulator netlist imported at block 111 is generated at block 119. In the example provided in FIG. 2, the top-level connectivity points in the IC are referenced to identify where to back-annotate the RLCK netlist into the original simulator netlist. As used herein, back-annotation can be defined to mean that the RLCK netlists generated by the SLBA modeling engine are imported into the simulator netlist of the schematic data file. For an SDL generated layout, the cross-reference information is part of the database; otherwise, a set of built-in rules are used to create the cross-reference. These matching rules use all available information from layout and netlist, such as number of instances per net, number of instances per instance type, number and type of instances that connect to each top level port, and number of device ports per instance.

Utilizing the cross-reference generated at block 119, the simulator netlist imported at block 111, and the RLCK netlist(s) generated at block 117, an updated simulator netlist, which includes RLCK parasitics for the connectivity points in the integrated circuit, is generated at block 121. In some embodiments, updating the simulator netlist requires separating the simulator netlist into multiple simulator nets, and connecting each of the simulator nets to a respective one of the RLCK netlists. In order to update the simulator netlist, each device node in the netlist is updated with the corresponding connectivity point using the cross-reference file and the generated RLCK netlist(s). At block 123, an indication of the updated simulator netlist is output to the user (e.g., saved as a digital file in the mass storage device 24 and, optionally, displayed via the display device 14 of the EDA computer system 10). Finally, at block 125, the updated simulator netlist generated at block 121 is imported via a simulation engine and a simulation is performed with the updated files.

Schematic-Layout Back-Annotation (LVS) Flow

Figure 3:
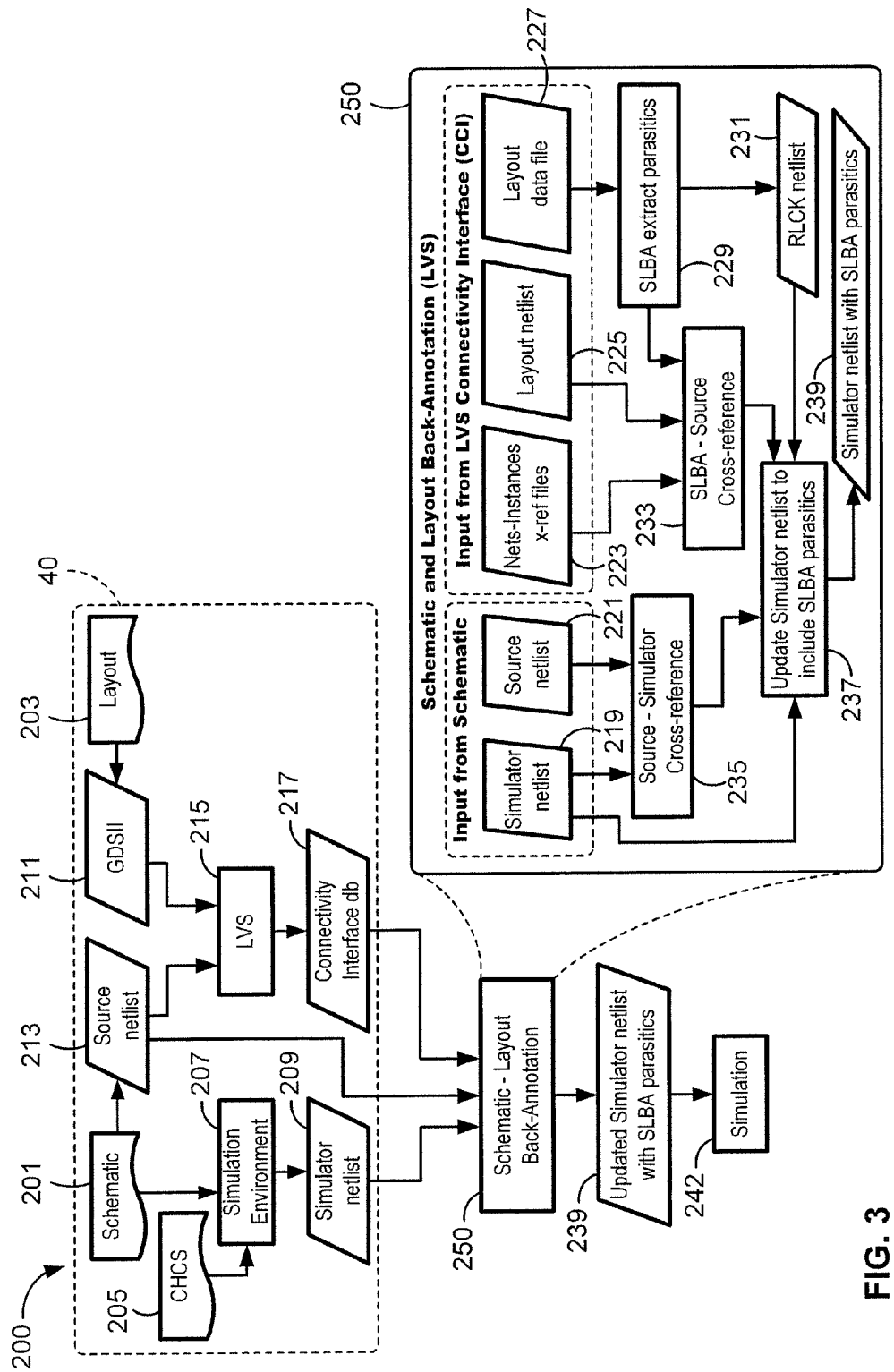
FIG. 3 is a flowchart for another representative method or algorithm for providing RLCK parasitic extraction in EDA of integrated circuits (Schematic-and-Layout Back-Annotation Flow (LVS)) that can correspond to instructions which can be stored on one or more non-transitory computer-readable media and can be executed by one or more controllers in accord with aspects of the disclosed concepts.

Turning next to the flow chart of FIG. 3, another method for providing RLCK parasitic extraction in computer-aided electronic simulation and design of integrated circuits is generally described at 200 in accordance with aspects of the present disclosure. Similar to the embodiment illustrated in FIG. 2, the flowchart in FIG. 3 can be representative of an algorithm that corresponds to at least some instructions that can be stored, for example, in memory 22 or mass storage 24 of FIG. 1, and executed, for example, by the CPU 20, either alone or in cooperation with external system(s) 30 and/or internal network 36, to perform the corresponding functions. The method 200 can incorporate or otherwise take on any of the various features and operations, optional configurations, and functional alternatives described herein with respect to the examples shown in FIGS. 2 and 4. Similar to the method 100 of FIG. 2, for example, the method 200 of FIG. 3 starts in design suite 40 at blocks 201 and 203 with the generation of schematic and layout data files, respectively, of the IC design under investigation. Next, a circuit hierarchy configuration setup (CHCS) is generated at block 205 and, once generated, the schematic data file and the CHCS are imported into an IC simulation environment (e.g., the VIRTUOSO® Analog Design Environment (ADE)) at block 207. IC simulation environment is then used to generate a simulator netlist out of the schematic view and CHCS, as indicated at block 209.

By way of contrast to the flow presented in FIG. 2, the method 200 of FIG. 3 requires that, prior to exporting the layout data file to the Schematic-and-Layout Back-Annotation (LVS) Flow 250, the layout file be stored in a standard file format at block 211. As indicated above, the layout specifies the geometries of the physical layout of the IC circuitry, including the various mask and process layers. The design layout is made up of semiconductor layouts of the circuit elements, with a connective topography that should be the same as that given in the schematic diagram. Once the layout functionality is verified, the final layout and associated netlist may be converted to a standard database file format, such as the GDSII stream file format, the CIF file format, the OASIS file format, or any other file or database formats used to store layout or mask data. GDSII stream file format is currently the de facto industry standard for data exchange of integrated circuit layout artwork (with other formats, such as OASIS, gaining traction for replacing GDSII). It is a binary file format that can be used to reconstruct all or part of the artwork to be used in sharing layouts, transferring artwork between different tools, and creating photomasks. All necessary files, including mask layout GDSII files, netlists and technology files, can be securely encrypted, for example, using 128 bit protocol.

At block 213, a netlist text file is extracted from the schematic information of the IC. Depending on software and simulation engine, this netlist (generally referred to herein as "source netlist") can be a Circuit Design Language (CDL) netlist, which is a subset of the SPICE format and is used to exchange circuit information between design suites like CADENCE® VIRTUOSO® and other EDA tools. The source netlist, which is formatted in a generic SPICE language, describes the circuit by means of devices and their connectivity and is a common input to Layout Versus Schematic (LVS) tools. By way of comparison to the simulator netlist generated at block 209, the source netlist of block 213 typically cannot be used by simulators since it omits many device parameters that are needed for simulation. The simulator netlist, on the contrary, has information that a circuit simulator needs to simulate the user's test configuration (i.e., "configuration view"). According to the illustrated example of FIG. 3, the SLBA 250 provides a "simulateable" output; since the source netlist cannot be used for this matter, the simulator netlist acts as the source for back-annotating the generated RLCK parasitics.

With continuing reference to FIG. 3, the source (CDL) netlist from block 213 is fed to an LVS tool 215 along with the layout standard file format (GDSII) from block 211. This flow uses the LVS tool 215 to determine the correspondence of devices and nets between schematic and layout. The LVS technique and computer software detects connectivity mismatches between the mask layout block according to the schematic data file (netlist). The LVS tool 215 can verify mask layout interconnection(s) by comparing them to the corresponding schematic data file (netlist). For some embodiments, the LVS tool 215 performs the following steps: first, the tool extracts device information from the layout standard file format; second, the tool identifies connectivity information and generates a layout netlist; and, third, the tool compares the layout netlist and the source netlist in order to see whether the layout implementation matches the initial schematic implementation. Supposing there are no "compare errors" and the layout matches the schematic, then the layout netlist can be used as a reference to generate a simulate-able netlist with the same behavior as the schematic netlist. An LVS connectivity interface (sometime referred to as "CCI") database 217 stores the files generated by the LVS tool 215 and acts as the API for the SLBA to extract information from the LVS tool.

At blocks 219 and 221, respectively, the simulator netlist extracted from the schematic information at block 209 and the source netlist extracted from the schematic information at block 213 are imported into or otherwise received by the Schematic-and-Layout Back-Annotation (LVS) Flow 250 as inputs from the schematic data file. In the same vein, nets&instances cross-reference files, the layout netlist, and the layout data file are all imported from the GDSII and source net list via the LVS tool 215 and LVS connectivity database 217 at blocks 223, 225 and 227, respectively. Nets&Instances cross-reference files are the cross-reference files generated by the LVS tool 215 to conduct the comparison between the layout netlist and the source netlist. For some implementations, the layout netlist is a critical component since it is where the RLCK parasitics will be connected. Annotated layout data file, which is generated by the LVS tool, contains the initial geometrical information of the layout. Additionally, net connectivity and device information are annotated on top of the layout data file. The layout data file is where the SLBA 250 gets the metal structures to feed to the SLBA modeling engine.

The SLBA-Simulator cross-reference 119 in the SLBA (no-LVS) flow 150 of FIG. 2 is directly provided from the "schematic-driven layout" tool where the SLBA 150 reads layout and identifies cross-reference information for the corresponding simulator netlist. The back-annotation platforms in FIGS. 3 and 4, by contrast, process the annotated layout data file to extract parasitics for the metal shapes in the IC. The LVS connectivity interface 217 provides cross reference information between the (GDSII) layout netlist and the (CDL) source netlist. The method 200 of FIG. 3 proceeds to block 229 where a connectivity list is generated or otherwise determined from the layout data file. This connectivity list comprises connectivity points within the integrated circuit for generating RLCK parasitics. At block 231, one or more RLCK netlists are generated for the connectivity points identified by the SLBA modeling engine at block 229.

From the nets&instances cross-reference files, the layout netlist, and the connectivity list, a cross-reference between the connectivity points identified at block 229 and the nets and devices in the source netlist is generated at block 233. Likewise, the simulator and source netlists imported at 219 and 221 are utilized at block 235 to generate a cross-reference between the nets and devices in the source list and the nets and devices in the simulator netlist. These cross-references are then imported into block 237 where the source-simulator cross-reference is mapped against the SLBA-source cross-reference to establish a cross-reference between the top-level connectivity points and the nets and devices in the simulator netlist. The SLBA 250 provides as an output a final netlist that can be simulated by a user's circuit simulator. Since the source netlist 213 is not, by itself, "simulateable," the SLBA 250 maps the nets and devices from the SLBA-source netlist cross-reference to the simulator-source netlist cross-reference to establish an SLBA-simulator netlist cross-reference.

Utilizing the cross-references generated at blocks 233 and 235, as well as the simulator netlist imported at block 219, and the RLCK netlist(s) generated at block 231, an updated simulator netlist, which includes RLCK parasitics for the connectivity points in the integrated circuit, is generated at block 237. In this step, the initial simulator netlist that contains the devices of the schematic design is connected to the SLBA extracted netlist. As a non-limiting example, when the ports of two devices connect to each other, one common net can be defined:

Device1 Net1 Net2
Device2 Net2 Net3

When a user selects Net2 to get extracted by the SLBA, then Net2, in order to get enriched with RC or RLCK parasitics, is "broken" into multiple nets where the parasitic elements will get connected:

Device1 Net1 Net2_1
Device2 Net2_2 Net3
SLBA Net2_1 Net2_2

This is the updated netlist where the simulator can "see" that between Device1 and Device2, there exists another (virtual) device SLBA that includes the parasitics model of Net2. In other words, SLBA updates the connectivity of the circuits' devices so that they connect to their corresponding parasitics. At block 239, an indication of the updated simulator netlist is output to the user (e.g., saved as a digital file in the mass storage device 24 and, optionally, displayed via the display device 14 of the EDA computer system 10). Finally, at block 241, the updated simulator netlist generated at block 237 is imported via a simulation engine and a simulation is performed with the updated files.

LVS-LPE Back-Annotation Flow

Figure 4:
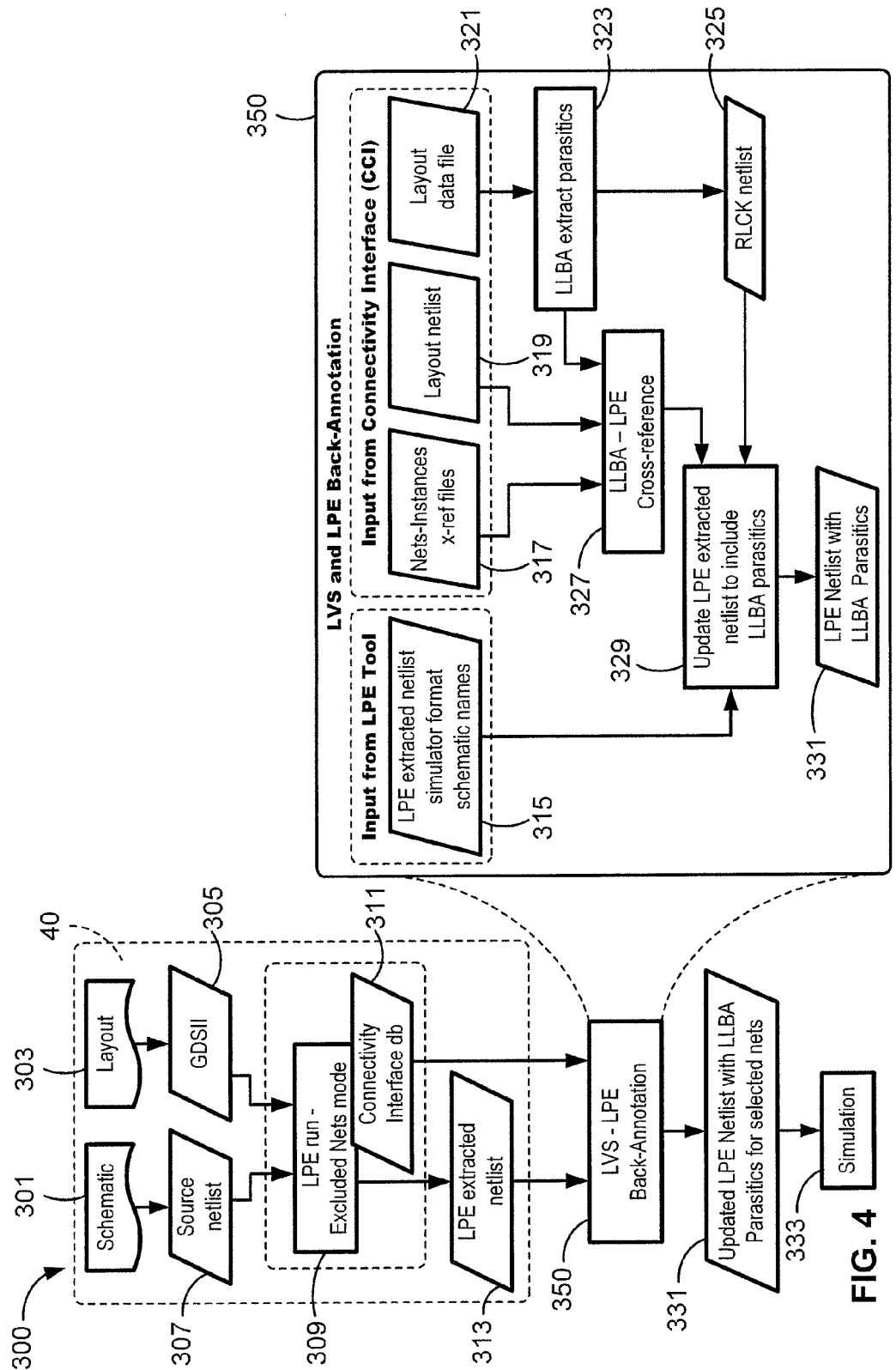
FIG. 4 is a flowchart for yet another representative method or algorithm for providing RLCK parasitic extraction in EDA of integrated circuits (LVS and LPE Back-Annotation Flow) that can correspond to instructions which can be stored on one or more non-transitory computer-readable media and can be executed by one or more controllers in accord with aspects of the disclosed concepts.

Presented in FIG. 4 is another method for providing RLCK parasitic extraction in computer-aided electronic simulation and design of integrated circuits in accordance with aspects of the present disclosure. Similar to the embodiments illustrated in FIGS. 2 and 3, the flowchart in FIG. 4 can be representative of an algorithm that corresponds to instructions that can be stored, for example, in memory 22 and/or mass storage 24 of FIG. 1, and executed, for example, by the CPU 20, external system(s) 30 and/or internal network 36. The method 300 can incorporate or otherwise take on any of the various features, operations, optional configurations, and functional alternatives described above with respect to the examples shown in FIGS. 2 and 3. Similar to the method of FIGS. 2 and 3, for example, the method 300 of FIG. 4 starts in design suite 40 at blocks 301 and 303 with the generation of schematic and layout data files, respectively, of the IC design under investigation. Similar to block 211 of FIG. 3, block 305 in FIG. 4 includes storing the layout data file in a standard file format, such as the GDSII stream file format or other file or database formats used to store layout or mask data. Likewise, the method 300 also requires extracting a source netlist from the schematic data file, as indicated at block 307. Similar to the netlist text file that is extracted at block 213 in FIG. 3, the source netlist of FIG. 4 may be formatted as a CDL netlist or other generic SPICE language that describes the IC by means of devices and their connectivity.

Source (CDL) netlist 307 is subsequently fed to an LPE tool 309 along with the layout (GDSII) standard file format 305. In the embodiment of FIG. 4, the LVS and LPE Back-Annotation Flow (LLBA) 350 can seamlessly connect the parasitics extracted by a third party Layout Parasitic Extraction (LPE) tool and the selected nets that are extracted by LLBA to a hybrid model. Using this flow, a designer can continue to use the LPE tool of their choice for RC extraction for selected nets of the design, and can easily and without any modifications to the original design select one or more "significant" nets that need accurate magnetic coupling extraction and feed these selected nets into the LLBA engine 350 for RLCK parasitic extraction and back-annotation. To generate a hybrid model using a combination of the LPE tool and LLBA, users "exclude" a selected set of "significant" nets from the LPE run; the selected set of nets excluded from the LPE tool is included in the LLBA extraction process. The LPE step of extraction 309 includes an LVS run with connectivity interface database output 311, similar to block 217 in FIG. 3. Depending on the LPE tool, this connectivity interface database 311 can be generated during one LPE step or in two discrete LVS+LPE runs, for example; however, the input of interest to LLBA 350 is the same.

The LPE run 309 also extracts an LPE netlist, as indicated at block 313 of FIG. 4. Similar to the simulator netlists generated at blocks 109 and 209 in FIGS. 2 and 3, respectively, the LPE tool 309 of FIG. 4 is capable of providing as an output a "simulateable" netlist for the user's circuit simulator engine. This output—LPE extracted netlist—contains all of the devices from the initial schematic design plus all RC parasitics generated from the LPE tool. The LLBA 350 of FIG. 4 extracts one or more RLCK netlists and connects the extracted netlist(s) to the LPE extracted netlist, as described in further detail below.

At block 315, the LPE extracted netlist from block 313 is imported into or otherwise received by the LVS-LPE Back-Annotation Flow 350 as input from the schematic data file. Similar to the SLBA 250 flow of FIG. 3, nets&instances cross-reference files, the layout netlist, and the layout data file are all imported from the GDSII and source net list via the LPE tool 309 and connectivity interface database 311 at blocks 317, 319 and 321, respectively. The method 300 of FIG. 4 proceeds to block 323 where a connectivity list is generated or otherwise determined from the layout data file. In contrast to the configurations described above with respect to FIGS. 2 and 3, this connectivity list comprises selected connectivity points within the integrated circuit for generating RLCK parasitics, e.g., the selected set of nets excluded from the LPE tool is included in the LLBA extraction process. At block 325, one or more RLCK netlists are generated for the connectivity points identified by the LLBA modeling engine at block 323.

From the nets&instances cross-reference files, the layout netlist, and the connectivity list, a cross-reference between the connectivity points identified at block 323 and the nets and devices in the LPE extracted "simulator format" netlist is generated at block 327 of FIG. 4. In this embodiment, the LPE tool 309 output is the LPE extracted reference netlist for simulations; the LLBA 350 therefore generates a cross-reference between the connectivity points for the selected set of nets excluded from the LPE tool and the connectivity points in the integrated circuit that were used to extract RLCK parasitics. Utilizing the cross-reference generated at block 327, as well as the LPE extracted "simulator format" netlist imported at block 315, and the RLCK netlist(s) generated at block 325, an updated simulator netlist, which includes RLCK parasitics for the connectivity points in the integrated circuit, is generated at block 329. Thus, the "Full LPE netlist" can be considered as equivalent to the LPE-Tool netlist having nets and devices and RC parasitics for selected nets plus LLBA RLCK parasitics for selected "significant" nets. At block 331, an indication of the updated simulator netlist is output to the user (e.g., saved as a digital file in the mass storage device 24 and, optionally, displayed via the display device 14 of the EDA computer system 10). Finally, at block 333, the updated simulator netlist generated at block 237 is imported via a simulation engine and a simulation is performed with the updated files.

Aspects of this disclosure can be implemented, in some embodiments, through a computer-executable program of instructions, such as program modules, generally referred to as software applications or application programs executed by a computer. The software can include, in non-limiting examples, routines, programs, objects, components, and data structures that perform particular tasks or implement particular abstract data types. The software can form an interface to allow a computer to react according to a source of input. The software can also cooperate with other code segments to initiate a variety of tasks in response to data received in conjunction with the source of the received data. The software can be stored on any of a variety of memory media, such as CD-ROM, magnetic disk, bubble memory, and semiconductor memory (e.g., various types of RAM or ROM).

Moreover, aspects of the present disclosure can be practiced with a variety of computer-system and computer-network configurations, including tabletop devices, multiprocessor systems, microprocessor-based or programmable-consumer electronics, mainframe computers, and the like. In addition, aspects of the present disclosure can be practiced in distributed-computing environments where tasks are performed by remote-processing devices that are linked through a communications network. In a distributed-computing environment, program modules can be located in both local and remote computer-storage media including memory storage devices. Aspects of the present disclosure can therefore, be implemented in connection with various hardware, software or a combination thereof, in a computer system or other processing system.

Any of the methods described herein can include machine readable instructions for execution by: (a) a processor, (b) a controller, and/or (c) any other suitable processing device. Any algorithm, software, or method disclosed herein can be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a controller and/or embodied in firmware or dedicated hardware in a well-known manner (e.g., it can be implemented by an application specific integrated circuit (ASIC), a programmable logic device (PLD), a field programmable logic device (FPLD), discrete logic, etc.). Also, some or all of the machine readable instructions represented in any flowchart depicted herein can be implemented manually. Further, although specific algorithms are described with reference to flowcharts depicted herein, persons of ordinary skill in the art will readily appreciate that many other methods of implementing the example machine readable instructions can alternatively be used. For example, the order of execution of the blocks can be changed, and/or some of the blocks described can be changed, eliminated, or combined.

It should be noted that the algorithms illustrated and discussed herein as having various modules or blocks or steps that perform particular functions and interact with one another are provided purely for the sake of illustration and explanation. It should be understood that these modules are merely segregated based on their function for the sake of description and represent computer hardware and/or executable software code which can be stored on a computer-readable medium for execution on appropriate computing hardware. The various functions of the different modules and units can be combined or segregated as hardware and/or software stored on a non-transitory computer-readable medium as above as modules in any manner, and can be used separately or in combination.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of the invention as defined in the appended claims.

What is claimed is:

1. A method of providing resistance-inductance-capacitance-mutual inductance (RLCK) parasitic extraction for electronic design of an integrated circuit, the method comprising:
   receiving a simulator netlist extracted from a schematic data file indicative of a simulated representation of the integrated circuit, the simulator netlist describing nets and devices in the schematic data file;
   receiving a layout data file indicative of a physical layout of the integrated circuit;
   determining from the layout data file a connectivity list with a plurality of connectivity points in the integrated circuit for connecting generated RLCK parasitics;
   determining from the layout data file one or more RLCK netlists for the connectivity points;
   determining from the layout data file and the connectivity list a cross-reference between the connectivity points and nets and devices in a netlist;
   determining from the cross-reference, the simulator netlist, and the one or more RLCK netlists an updated simulator netlist which includes RLCK parasitics for the connectivity points in the integrated circuit; and
   outputting an indication of the updated simulator netlist.

2. The method of claim 1, wherein the determining the cross-reference is further based on the simulator netlist, and wherein the cross-reference is between the connectivity points and the nets and devices in the simulator netlist.

3. The method of claim 1, wherein the determining the updated simulator netlist includes separating the simulator netlist into multiple simulator nets, and connecting the simulator nets to the one or more RLCK netlists.

4. The method of claim 1, wherein the simulator netlist is extracted from the schematic data file with a design suite simulation environment that is operable as an application programming interface (API) for accessing data from a circuit hierarchy configuration setup of the integrated circuit.

5. The method of claim 1, wherein the layout data file, prior to being received, is stored in a standard file format, the method further comprising receiving a layout netlist and a nets&instances cross-reference file from the standard file format version of the layout data file.

6. The method of claim 5, wherein the layout netlist includes nets and devices information extracted from the layout data file, and wherein the nets&instances cross-reference file includes a cross-reference between the layout netlist and a source netlist.

7. The method of claim 6, wherein the layout netlist and the nets&instances cross-reference file are imported from a connectivity interface database of a Layout Versus Schematic (LVS) software tool.

8. The method of claim 7, wherein the determining the cross-reference is further based on the layout netlist and the nets&instances cross-reference file, and wherein the cross-reference is between the connectivity points and the nets and devices in the source netlist.

9. The method of claim 8, further comprising:
   receiving a source netlist extracted from the schematic data file; and
   determining from the source netlist and the simulator netlist a second cross-reference between nets and devices in the source list and nets and devices in the simulator netlist,
   wherein the determining the updated simulator netlist is further based on the second cross-reference.

10. The method of claim 6, wherein the layout netlist and the nets&instances cross-reference file are imported from a connectivity interface database of a Layout Parasitic Extraction (LPE) software tool.

11. The method of claim 10, wherein the determining the cross-reference is further based on the layout netlist and the nets&instances cross-reference file, and wherein the cross-reference is between the connectivity points and nets and devices in the simulator netlist.

12. The method of claim 11, wherein the simulator netlist is an LPE extracted netlist extracted from the schematic data file via the LPE software tool, and wherein the determining the updated simulator netlist is further based on the LPE extracted netlist.

13. A computer-aided electronic design automation (EDA) system for electronic design of an integrated circuit, the EDA system comprising:
   one or more user input devices;
   one or more display devices;
   one or more processors; and
   one or more memory devices storing instructions which, when executed by at least one of the one or more processors, cause the EDA system to:
      import a simulator netlist extracted from a schematic data file indicative of a simulated representation of the integrated circuit, the simulator netlist describing nets and devices in the schematic data file;
      import a layout data file indicative of a physical layout of the integrated circuit;
      from the layout data file, generate a connectivity list with a plurality of connectivity points in the integrated circuit for connecting generated RLCK parasitics;
      from the layout data file, extract one or more RLCK netlists for the connectivity points;
      from the layout data file and the connectivity list, generate a cross-reference between the connectivity points and nets and devices in a netlist;
      from the cross-reference, the simulator netlist, and the one or more RLCK netlists, update the simulator netlist to include RLCK parasitics for the connectivity points in the integrated circuit; and
      store or display, or both, an indication of the updated simulator netlist.

14. One or more non-transitory computer-readable storage media including instructions which, when executed by one or more processors, cause the one or more processors to perform operations comprising:
   receiving a simulator netlist extracted from a schematic data file indicative of a simulated representation of the integrated circuit, the simulator netlist describing nets and devices in the schematic data file;
   receiving a layout data file indicative of a physical layout of the integrated circuit;
   determining from the layout data file a connectivity list with a plurality of connectivity points in the integrated circuit for connecting generated RLCK parasitics;
   determining from the layout data file one or more RLCK netlists for the connectivity points;
   determining from the layout data file and the connectivity list a cross-reference between the connectivity points and nets and devices in a netlist;
   determining from the cross-reference, the simulator netlist, and the one or more RLCK netlists an updated simulator netlist which includes RLCK parasitics for the connectivity points in the integrated circuit; and
   output an indication of the updated simulator netlist.

15. The non-transitory computer-readable storage media of claim 14, wherein the determining the cross-reference is further based on the simulator netlist, and wherein the cross-reference is between the connectivity points and the nets and devices in the simulator netlist.

16. The non-transitory computer-readable storage media of claim 14, wherein the determining the updated simulator netlist includes separating the simulator netlist into multiple simulator nets, and connecting the simulator nets to the one or more RLCK netlists.

17. The non-transitory computer-readable storage media of claim 14, wherein the layout data file, prior to being received, is stored in a standard file format, the method further comprising receiving a layout netlist and a nets&instances cross-reference file from the standard file format version of the layout data file.

18. The non-transitory computer-readable storage media of claim 17, wherein the layout netlist includes nets and devices information extracted from the layout data file, and wherein the nets&instances cross-reference file includes a cross-reference between the layout netlist and a source netlist.

19. The non-transitory computer-readable storage media of claim 17, wherein the layout netlist and the nets&instances cross-reference file are imported from a connectivity interface database of a Layout Versus Schematic (LVS) software tool.

20. The non-transitory computer-readable storage media of claim 17, wherein the layout netlist and the nets&instances cross-reference file are imported from a connectivity interface database of a Layout Parasitic Extraction (LPE) software tool.

* * * * *